Feb. 11, 1969 H. SCHWARZ ET AL 3,427,510

SEMICONDUCTOR WITH ENCAPSULATING HOUSING

Filed Aug. 12, 1966

United States Patent Office 3,427,510

Patented Feb. 11, 1969

3,427,510
SEMICONDUCTOR WITH ENCAPSULATING HOUSING

Horst Schwarz, Munich-Allach, and Siegfried Plorin, Munich, Germany, assignors to Siemens Aktiengesellschaft, Munich, Germany, a corporation of Germany Filed Aug. 12, 1966, Ser. No. 572,051
Claims priority, application Germany, Aug. 12, 1965, S 98,798
U.S. Cl. 317—234
Int. Cl. H011 3/00, 5/00
3 Claims

ABSTRACT OF THE DISCLOSURE

A semiconductor device has the semiconductor member disposed between a pair of conductor plates with electrical connectors secured thereto and this unit supported within a cup-like rectangular housing. The end walls of the housing comprise guide means for positioning the unit or a plurality of units within the housing which is then filled with encapsulating insulation.

Figure 1:
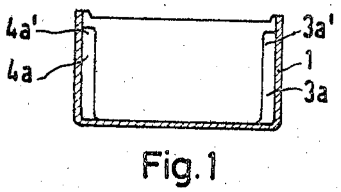

Our invention relates to semiconductor device.

In application Ser. No. 550,870, filed May 17, 1966, which is a continuation of application Ser. No. 397,561, filed Sept. 18, 1964, there is disclosed a semiconductor device according to which, by means of an auxiliary apparatus or jig, individual semiconductor members are inserted between bus bar-like components and are connected therewith by a soldering process. The thus formed electrical assembly can then be inserted in a suitable housing and can be encapsulated therein, for example by introducing an appropriate casting resin therein.

In this connection, one might be led to conclude that, in order to have a cup-shaped housing with the greatest possible mechanical stability, one should provide ribs on the longitudinal walls extending perpendicularly to the longitudinal axis of the rectangular cross section of the housing, so as to achieve in this manner a mechanical stiffening or bracing of this housing. However, it has been found that providing such a housing with ribs, which ultimately lie in the insulating material poured into or filling the hollow interior of the housing, has not proven to be feasible but, rather on the contrary, leads to the formation of mechanical stresses in the housing due to thermal expansion of the insulating cast material.

It is accordingly an object of our invention to provide an encapsulated semiconductor device which avoids the foregoing disadvantages of the heretofore known devices of this type and which more particularly avoids the aforementioned deficiencies of the previously known housings that would tend to have a disadvantageous effect on the encapsulated semiconductor device.

With the foregoing and other objects in view, we provide in accordance with our invention, semiconductor device comprising an electrical assembly of at least one semiconductor member sandwiched between a pair of conductor plates or bars soldered thereto, the semiconductor member being, for example, of germanium, silicon or an intermetallic compound, the contact plates or bars being furthermore provided, if desired, with suitable A-C and D-C connectors or leads for the electrical assembly. The electrical assembly is guided by the conductor plates or bars thereof in guides provided in a cup-like housing filled with insulating material. The housing has a rectangular cross section perpendicular to the central axis thereof and the guides are located on the interior of the smaller area walls thereof. The inner surfaces of the longitudinal larger area walls of the cup-shaped housing are continuously smooth at least in the longitudinal direction thereof, and both of the longitudinal walls with respect to the longitudinal symmetry plane of the cup-shaped housing have cross sections that are mirror images of one another.

By the foregoing statement that the longitudinal walls of the cup-shaped housing are continuously smooth at least in their longitudinal direction, it is meant also that a smooth shaping of the longitudinals walls perpendicular to the base of the cup-shaped housing can also be chosen. This is, however, no absolutely necessary condition, but rather is another feature within the scope of our invention, whereby the longitudinal walls are provided with ledges or separated portions extending in a vertical direction from the base of the cup-shaped housing and are continuously smooth over the entire length of the longitudinal walls. It is thus also, for example, within the scope of our invention to provide ledge or strip-like parts, which can also be integral components of the housing, on the longitudinal walls extending from the base of the cup-shaped housing to the top opening thereof. The strip-like parts form a unitary structure with the housing material and constitute guide pieces or guides in the cup-shaped housing extending in the longitudinal direction thereof, so that one or more self-supporting electrical assemblies of semiconductor members can be inserted in such guides extending from the base of the housing or located thereon. Thus, for example, each of such pluralities of, for example, two units can be supported at one side in a guiding groove at the smaller area side wall of the cup-shaped housing and at the other side on a part of the guide located above or on the base of the cup-shaped housing.

It is also within the scope of our invention to so construct the longitudinal walls that they form several ledges from the base in a direction toward the free rim of the cup-shaped housing. A particular guiding function can be assigned to the thus formed ledges, because such an embodiment, as aforementioned, is in keeping with the basic concept of our invention.

Since the entering cross sections of the guides for the semiconductor device that is to be inserted can lie below the level of the liquid insulating material when the cup-shaped housing is filled with that material before the semiconductor device is inserted, the subsequent insertion of the semiconductor device in these guides can be carried out only with difficulty. Such a deficiency can, however, be alleviated in accordance with the invention by providing entering cross sections of the guides which are initially larger than necessary for exact guidance and then narrowing a portion of the entering length of the guides down to the exact guide measurement which corresponds to the thickness of the guide rail or ledge. This feature proves to be especially favorable and desirable when the guides do not extend above a point located a specific distance below the free rim of the cup-shaped housing and are therefore not able to be seen readily when immersed in the filling matter or the filled liquid. The guides, at the cross section therefore first engaged by the electrical assembly being inserted therein, have a suitable rounding off or curvature of the ledge or strip members are face one another and form the guides, the strip members extending peripendicularly to the longitudinal axis of the housing.

Other features which are considered as characteristic for the invention are set forth in the appended claims.

Although the invention is illustrated and described herein as embodied in semiconductor device, it is nevertheless not intended to be limited to the details shown, since various modifications and structural changes may be made therein without departing from the spirit of the invention and within the scope and range of equivalents of the claims.

Figure 3:
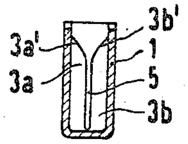
Figure 2:
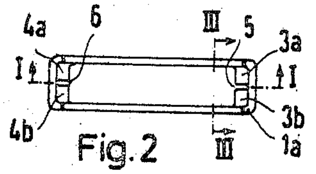
Figure 4:
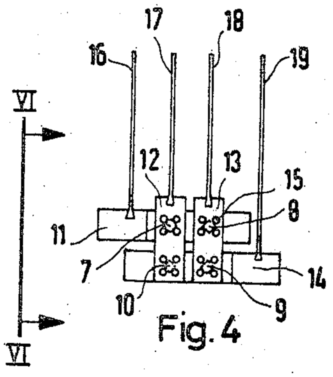
Figure 6:
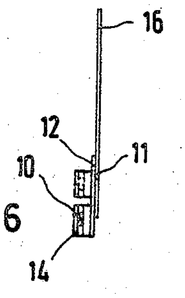
Figure 5:
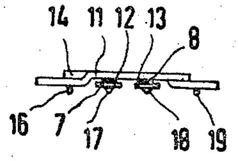
Figure 7:
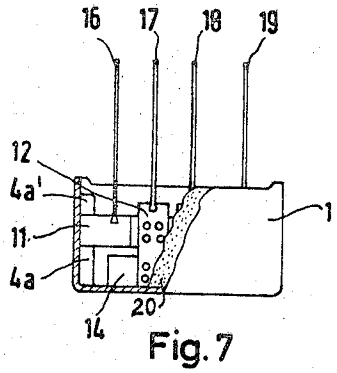

The construction and method of operation of the invention, however, together with additional objects and advantages thereof will be best understood from the following description of a specific embodiment when read in connection with the accompanying drawings, in which:

FIGS. 1 to 3 are a longitudinal section taken along the line I—I in FIG. 2, a top plan view and a transverse section taken along the line III—III in FIG. 2, respectively of a cup-like housing in accordance with our invention;

FIGS. 4 to 6 are a front elevational view, a top plan view and a side elevational view as seen from the line VI—VI in FIG. 4, respectively, of a complete semiconductor member electrical assembly; and FIG. 7 is a front elevational vie wpartly broken away of a semiconductor device consisting of the electrical assembly of FIGS. 4 to 6 inserted in the cup-like housing of FIGS. 1 to 3 in accordance with our invention.

Referring now to the drawing and first particularly to FIGS. 1 to 3 thereof, there is shown a cup-like housing 1, consisting of a polyester molding mass reinforced with glass fibers and having a rectangular cross section perpendicular to the longitudinal axis of the cup-like shape, the inner and outer surfaces of the lateral walls thereof meetings with the base of the housing 1 at rounded corners and edges, which construction is convenient and customary for producing such a housing 1 by a molding process. The housing 1 is provided at the ends of the shorter side walls 1*a* of the rectangular shape with inwardly extending projections or ledges 3*a* and 3*b* and 4*a* and 4*b*, so that between the pairs of projections 3*a* and 3*b* on the one hand and 4*a* and 4*b* on the other hand, a groove-like recess is formed.

The projections 3*a*, 3*b* and 4*a*, 4*b* extend from a location spaced a predetermined distance from the upper free rim of the cup-like housing down to the base thereof and have an initially rounded form at each of the longitudinally extending parts 3*a'*, 3*b'*, 4*a'*, 4*b'* at the upper ends thereof perpendicular to the longitudinal axis of the housing 1. The rounded portions, as shown more clearly in FIG. 3, extend downwardly in a direction to the guiding groove 5 proper of substantially uniform width corresponding to the thickness of the conductor plates or bars 11, 14 (FIGS. 4 to 6), so that as shown in FIG. 3, a somewhat tapering or narrowing entering cross section is provided for receiving the assembled unit of semiconductor members and conductor plates shown in FIGS. 4 to 6.

The assembly shown in FIGS. 4 to 6, for example, includes a single-phase bridge of rectifying elements 7 to 10. The semiconductor elements 7, for example a silicon semiconductor planer diode, is sandwiched between the horizontal conductor plate 11 and the vertical conductor plate 12, as seen in FIG. 4. Similarly, the semiconductor member 8 lies between the horizontal conductor plate 11 and the vertical conductor plate 13, the semiconductor member 10 lies between the horizontal conductor plate 14 and the vertical conductor plate 12, and the semiconductor member 9 lies between the vertical conductor plate 13 and the horizontal conductor plate 14. Circular through-channels 15 serve as auxiliary channels for assembling the device, for example, the conductor plates can be arranged in rows one after the other on a suitable jig (not shown), after which the mutual mechanical bonding process by soldering or alloying of the conductor plates and the semiconductor members can be carried out, for example, in accordance with the aforementioned copending application Ser. No. 550,870. Thus, the conductor plates 11 and 12 are strung on a suitable system of pins in a position as shown in FIG. 5, solder layers or discs are placed thereon superimposed by semiconductor members 7, 8 and 10, 9 and then, after placing additional solder discs thereon, superimposing conductor plates 12 and 13 on the respective pairs 7, 10 and

8, 9 of semiconductor members, whereafter the soldering bonding process is carried out. Thereafter, each of the electrical connector leads 16 to 19 is respectively secured to the conductor plates, preferably by welding. The electrical assembly of semiconductor members, conductor plates and connector leads produced in this manner and, if desired, also provided with etching and rinsing and with a protective coating of shellac on the surface of the semiconductor member, is then gripped by the connector wires 16 to 19 and inserted from above in a downward direction, as viewed in FIG. 7, into the cup-like housing 1 previously filled with heated fluid molding resin, whereby, with this insertion operation, the right-hand end of the horizontal conductor plate 14 and the left-hand end of the conductor plate 11 enter into a mutual guiding relationship with the projections 5 and 6 at the inner surface of the smaller side walls of the housing 1, until the semiconductor member electrical assembly reaches the final position in the downward direction within the cup-like housing 1, shown in FIG. 7, to provide a completed, encapsulated semiconductor device in accordance with the invention, wherein the electrical assembly is immersed in the insulation material 20 filling the interior of the housing 1. The molding resin 20 is hardened in the course of a conventional heat treating process whereby the inserted electrical assembly is mechanically secured in position and simultaneously is provided with good encapsulation so that it is protected especially from disadvantageous influences from the surrounding atmosphere.

As can be seen in FIGS. 4 to 6, the ends of the conductor plates 11 and 14 contributing to the formation of the mutual guides of housing and conductor plates are provided with a crank-like bend, so that these conductor plates, connector wires can be secured so that they extend only in a straight direction and in the same plane, and so that the connector wires of one of these encapsulated current rectifier devices, for example, already has a desired location for inserting it into the raster system of a printed circuit.

Furthermore, in such a construction, the relatively longer conductor plates which, due to their larger surface, simultaneously form very effective cooling plates for transmitting Joule heat from the semiconductor members to the molded insulating mass and through the latter to the housing, extend practically substantially symmetrical to both of the longitudinal walls of the cup-like housing.

We claim:

1. Semiconductor device comprising an electrical assembly of at least one semiconductor member sandwiched between and bonded to a pair of conductor plates and connector means secured to said conductor plates, and a cup-like housing having a rectangular cross section perpendicular to the central axis thereof, and having pairs of opposite smaller area walls and longitudinal larger area walls, said housing being filled with insulating material and being provided with guide means on the inner surface of the smaller area walls thereof, the inner surfaces of said longitudinal walls being continuously smooth at least in the longitudinal direction thereof, both of said longitudinal walls having cross sections that are mirror images of one another with respect to the longitudinal plane of symmetry of said cup-like housing, said electrical assembly being guidingly received by said conductor plates in said guide means within said cup-like housing.

2. Semiconductor device according to claim 1, wherein said guide means comprises a pair of spaced ledges extending along the respective inner surfaces of said smaller area walls, the spacing of said ledges having an entering cross section considerably greater than the thickness of said conductor plates and tapering to a spacing corresponding substantially to the thickness of said conductor plates.

3. Semiconductor device according to claim 2, wherein said guiding ledges are perpendicular to the longitudinal axis of said housing and are rounded convexly relative to the central axis of said guides.

References Cited

UNITED STATES PATENTS

| | | | |
|---|---|---|---|
| 2,830,238 | 8/1958 | Gudmundsen | 317—235 |
| 2,857,560 | 10/1958 | Schnable et al. | 317—234 |
| 2,981,873 | 4/1961 | Eamarino et al. | 317—234 |
| 3,256,469 | 6/1966 | Neuber et al. | 317—234 |

JAMES D. KALLAM, *Primary Examiner.*

U.S. Cl. X.R.

317—101; 29—592

UNITED STATES PATENT OFFICE

CERTIFICATE OF CORRECTION

Patent No. 3,427,510 February 11, 1969

Horst Schwarz et al.

It is certified that error appears in the above identified patent and that said Letters Patent are hereby corrected as shown below:

In the heading to the printed specification, line 9, "S 98,798" should read -- S 98,794 --.

Signed and sealed this 14th day of April 1970.

(SEAL)
Attest:

Edward M. Fletcher, Jr.
Attesting Officer

WILLIAM E. SCHUYLER, JR.
Commissioner of Patents